(12) United States Patent
Huang et al.

(10) Patent No.: US 10,608,128 B2
(45) Date of Patent: Mar. 31, 2020

(54) ALUMINUM PASTE USED FOR LOCAL BACK SURFACE FIELD SOLAR CELL AND LOCAL BACK SURFACE FIELD SOLAR CELL USING THE ALUMINUM PASTE

(71) Applicant: PANCOLOUR INK CO., LTD, Taoyuan County (TW)

(72) Inventors: Ying-Hua Huang, Taoyuan County (TW); Hung-Ing Chang, Taoyuan County (TW); Yu-Ching Pai, Taoyuan County (TW)

(73) Assignee: PANCOLOUR INK CO., LTD, Taoyuan County (TW)

( * ) Notice: Subject to any disclaimer, the term of this patent is extended or adjusted under 35 U.S.C. 154(b) by 0 days.

(21) Appl. No.: 16/042,211

(22) Filed: Jul. 23, 2018

(65) Prior Publication Data
US 2020/0028006 A1    Jan. 23, 2020

(51) Int. Cl.
*H01L 31/00* (2006.01)
*H01L 31/0224* (2006.01)
*H01B 1/22* (2006.01)
*C08K 3/40* (2006.01)
*C08K 3/08* (2006.01)

(52) U.S. Cl.
CPC ........ *H01L 31/022441* (2013.01); *C08K 3/08* (2013.01); *C08K 3/40* (2013.01); *H01B 1/22* (2013.01); *C08K 2003/0812* (2013.01)

(58) Field of Classification Search
CPC .................. H01L 31/022441; H01B 1/22
See application file for complete search history.

(56) References Cited

U.S. PATENT DOCUMENTS

2010/0059116 A1* 3/2010 Brenner ................ H01B 1/16
136/256
2010/0252095 A1* 10/2010 Senda .................. H01B 1/023
136/252

(Continued)

FOREIGN PATENT DOCUMENTS

WO    WO2015014032    2/2015

OTHER PUBLICATIONS

Horbelt et al. "Void formation on PERC solar cells and their impact on the electrical cell parameters verified by luminescence and scanning acoustic microscope measurements", Energy Procedia 84 (2015) 47-55, Elsevier.

*Primary Examiner* — Angelo Trivisonno
(74) *Attorney, Agent, or Firm* — WPAT, PC (57) ABSTRACT

An aluminum paste used for local back surface field solar cells is introduced. The aluminum paste which has large-sized aluminum powder; an organic vehicle including a solvent and a resin or cellulose; wherein a ratio of a median particle size (μm) to an oxygen content (%) (median particle size (μm)/oxygen content (%)) of the large-sized aluminum powder ranges from 10 to 15. The aluminum paste used for local back surface field solar cell and the local back surface field solar cell using the aluminum paste eliminate the powder extraction of aluminum powder, the aluminum beads, the adhesion of the aluminum layer to the $SiN_x$ capping layer, and the void issue occurred at the LBSF positions, which further improves the photoelectric conversion efficiency of the local back surface field solar cell.

10 Claims, 3 Drawing Sheets

(56) References Cited

U.S. PATENT DOCUMENTS

2013/0306141 A1* 11/2013 Nobori ............ H01L 31/022441
                                                          136/255
2019/0156966 A1*  5/2019 Zhu ......................... H01B 1/22
2019/0157477 A1*  5/2019 Zhu ................. H01L 31/022441

* cited by examiner

ALUMINUM PASTE USED FOR LOCAL BACK SURFACE FIELD SOLAR CELL AND LOCAL BACK SURFACE FIELD SOLAR CELL USING THE ALUMINUM PASTE

FIELD OF THE INVENTION

The present invention relates to an aluminum paste and, in particular, to an aluminum paste comprising large-sized aluminum powder having a specific ratio of particle size (μm) to oxygen content (%). The present invention also relates to a local back surface field solar cell applying the aluminum paste.

BACKGROUND OF THE INVENTION

In order to enhance the best efficiency performance, solar cell plants have gradually introduced local back surface field (LBSF) technology since 2013. The operating mode of this technique is Passivated Emitter and Rear Contact (PERC). The process uses Atomic Layer Deposition (ALD) or Chemical Vapor Deposition (CVD) to deposit $SiO_x$, $TiO_x$, or $AlO_x$ on the silicon wafer to serve as the back passivation layer, and then deposit $SiN_x$ by CVD process to form a capping layer. The main function of the passivation layer in the local back surface field solar cell is to repair defects on the surface of the silicon wafer. Because the cutting and processing of the silicon wafer will produce amorphous silicon having more dangling bonds, which, at the edge of the silicon wafer, will recombine the carriers generated after the silicon wafer is exposed to light, thereby reducing the carrier life time and deteriorating the electrical properties. However, the local back surface field solar cell will have increased open circuit voltage (Voc) and short circuit current (Isc) due to the function of the passivation layer, and thus can obtain significantly increased photoelectric conversion efficiency. Nevertheless, the passivation layer provides only limited aluminum-silicon contact, and therefore the series resistance (Rs) will be increased and the fill factor (FF) will be reduced.

The development of PERC aluminum paste is derived from silicon-based solar cells with a back passivation layer. The main difference between local back surface field solar cells and conventional solar cells is that the aluminum paste used in conventional silicon-based solar cells is screen printed on the back surface of the silicon wafer, in which the aluminum layer directly contacts the silicon wafer and forms a whole back surface field (BSF) after sintering, and, however, in the local back surface field solar cells, most (>95%) of the aluminum layer covers the $SiN_x$ capping layer, leaving only a limited laser opening area to directly contact aluminum with silicon, which further forms a local back surface field (LBSF) after sintering.

One of the major technical problems faced by LBSF technology is that if the aluminum layer attaches to the $SiN_x$ capping layer, then the passivation layer may be damaged. If the passivation layer is damaged, the local back surface field solar cell becomes unable to maintain improved open circuit voltage (Voc), short-circuit current ($I_{sc}$), electrical properties, and conversion efficiency. Secondly, because the contact between the aluminum layer and the silicon wafer only passes through the limited area of the laser opening, under the influence of appropriate amount of glass powder (1.0-5.0 wt %, based on the total weight of the aluminum paste), the particle size of the aluminum powder itself in the aluminum paste formulation and the thickness of the alumina layer on the surface of the aluminum powder will become critical to the occurrence of powder extraction, aluminum beads, and voids at the LBSF positions that affect the quality of the local back surface field solar cell during the aluminum-silicon eutectic melting process.

However, for today's silicon-based solar cells with the back passivation layer, all focus is on the application of glass frit to the aluminum paste formulation for controlling the erosion and adhesion capability of the aluminum layer to the back passivation layer ($SiO_x$, $TiO_x$, or $AlO_x/SiN_x$) of the local back surface field solar cell. It can be seen that all the prior arts ignore the influence of the aluminum powder, which accounts for more than 60 wt % of the aluminum paste, on the whole quality characteristics and reliability of the local back surface field solar cell during the sintering process, and the above technical problems have never been addressed or advised, either. For example, there has been proposed an aluminum paste containing 60 to 87 wt % of aluminum powder and glass frit having a high lead content. The adhesion between the aluminum paste and the capping layer is strengthened by utilizing the easily meltable and easily reactive properties of the lead oxide (PbO). However, in the prior arts, the influence of the issues, such as the powder extraction, aluminum beads, the adhesion of the aluminum layer to the $SiN_x$ capping layer, the voids occurred at the LBSF positions, etc. incurred by the aluminum paste containing more than 60 wt % aluminum powder during the sintering of the aluminum paste with silicon, on the whole quality characteristics and reliability of the local back surface field solar cell has never been investigated.

Therefore, how to develop an aluminum paste that can be used in LBSF and eliminate the issue of the photoelectricity conversion efficiency of the local back surface field solar cell incurred by the occurrence of phenomena, such as the powder extraction of aluminum layer, the aluminum beads, the adhesion of the aluminum layer to the $SiN_x$ capping layer, the voids at the LBSF positions, etc., is now the technical focus of all LBSF research and development personnel.

SUMMARY OF THE INVENTION

To solve the above-mentioned deficiencies of prior arts, the present invention provides an aluminum paste used for local back surface field solar cells and a local back surface field solar cell using the aluminum paste.

More specifically, the present inventors complete the present invention based on the following theories.
Powder Extraction The phenomenon of powder extraction of aluminum paste during the sintering for manufacturing the LBFS is mainly related to the melting rate of aluminum powder. Theoretically, in traditional or conventional solar cells, the metal paste (front silver paste, back silver paste, back aluminum paste) for general P-type silicon-based solar cells has a firing peak temperature of 720~820° C. after printing and drying, and the aluminum layer fully contacts the silicon wafer, so the aluminum powder will undergo eutectic reaction with the silicon wafer when the temperature is above the lowest eutectic point of the aluminum-silicon system, i.e. 577° C. Alternatively, in traditional or conventional solar cells, since the melting point of pure aluminum is 660.32° C., the molten aluminum will break through the alumina shell on the surface of the aluminum powder after the temperature is at or above the melting point of the aluminum, and the molten aluminum may flow out and have the opportunity to form aluminum-silicon alloy with the silicon wafer.

On the contrary, the percentage of aluminum that can undergo eutectic reaction with silicon in the silicon wafer of the local back surface field is much lower than that in traditional or conventional silicon-based solar cells because of the existence of the passivation layer, though the aluminum layer in the aluminum powder has an opportunity to contact with silicon due to the local laser opening. Furthermore, once aluminum flows between porous alumina shells after melting, the molten aluminum that has not been eutectically reacted with the silicon in time may flow to the surface of the aluminum layer due to the high coefficient of thermal expansion. If the molten aluminum is cooled again, irregular small particles will form on the surface of the aluminum layer, which phenomenon is so called the powder extraction of aluminum powder. The occurrence of such powder extraction will affect the adhesive strength of the ethylene vinyl acetate (EVA) lamination when forming the module, thereby deteriorating the reliability and shortening the shelf life of the solar cell module.

Aluminum Beads

If the composition of the aluminum bead is analyzed by scanning electron microscopy with energy dispersive X-ray spectroscopy (SEM/EDX), it can be seen that the aluminum bead is mainly composed of aluminum element and 5.0 to 30.0 wt % of silicon. Therefore, the occurrence of aluminum bead is explored and found that the existence of the back passivation layer of the local back surface field solar cell blocks the eutectic melting of the aluminum-silicon system. Although it is known that the diffusion speed of silicon in the aluminum layer is quite high, in order to prevent the passivation layer from being damaged greatly at the peak temperature of sintering for the local back surface field solar cell, the firing peak temperature mentioned above will be 20~40° C. lower than that used for the traditional or conventional solar cell. Thus, the distribution of aluminum-silicon alloy during sintering will not be very uniform. Furthermore, during the cooling process, the silicon in the aluminum-silicon alloy returns to the silicon wafer as the temperature decreases, resulting in more uneven distribution of the aluminum-silicon alloy and pure aluminum in the aluminum layer. Therefore, in the case of a significant difference in thermal expansion coefficient, the aluminum-silicon alloy with a smaller thermal expansion coefficient has a slower shrinkage rate during the cooling process, and thus a portion of aluminum-silicon alloy will be excluded onto the film surface by the pure aluminum due to the rapid shrinkage rate during cooling, resulting in the formation of aluminum beads.

The problem of easily generating aluminum beads in the sintering process of the aluminum paste for the local back surface field lies in the effective control of the timing and rate of the reaction between aluminum and silicon. When the aluminum powder participates in the aluminum-silicon eutectic reaction, in addition to that the glass frit is pre-melted during sintering to erode the alumina on the surface of the aluminum powder for making the pure aluminum flow out of the alumina shells after melting and react with silicon, the particle size of aluminum powder itself and the thickness of the alumina shell become the major factors that affect the timing and rate of reaction between aluminum and silicon. When the aluminum powder is small (D50: 1.0~3.0 μm), its melting rate is much higher than that of the large-sized aluminum powder (D50: 6.0~9.0 μm) under the same heating conditions due to its large specific surface area. Therefore, the chance of generating aluminum beads during sintering will be significantly increased.

Further, in addition to that the particle size will affect the melting rate of aluminum powder, the thickness of the alumina shell on the surface of aluminum powder is also a major factor that affects the speed of molten aluminum outflow. The thickness of the alumina shell on the surface of the aluminum powder is positively related to the oxygen content in the aluminum powder. The thicker the alumina shell, the stronger its ability to withstand the erosion of the glass powder, i.e., the later the timing the molten aluminum outflows. However, the excessively high degree of oxidation (excess oxygen content) means that the alumina content in the aluminum paste is more, which causes negative impact on the structure strength of the whole aluminum layer, resulting in weakening of the EVA bonding strength after lamination, in addition to the impact on the conductivity. Although it can be improved by increasing the amount of glass frit added, after all, the glass frit is not a conductive material. If more glass frit is used to increase the structural strength of the aluminum layer, the electrical properties must be affected due to the increase in resistance. Therefore, appropriate particle size of aluminum powder in combination with appropriate thickness of surface alumina shell on the surface of the aluminum powder (oxygen content in the aluminum powder) is the key factor that can effectively suppress the generation of aluminum beads while maintaining the desired conductivity.

Voids

In order to allow the aluminum paste to be in direct contact with the silicon wafer and provide a space for the aluminum-silicon to have a good ohmic contact and to facilitate carrier transfer after the sintering, the conventional method utilizes laser opening to produces patterns with different characteristics in the back passivation layer of the silicon-based P-type solar cell. Since the thickness of the back passivation layer is only 80 to 150 nm, and the laser with appropriate power can ablate 1.0~3.0 μm of the thickness of the back passivation layer, the pure silicon of the silicon wafer can be fully exposed at the laser opening positions after laser irradiation and therefore has a chance to contact with the aluminum layer. During the eutectic melting of the aluminum-silicon system in the sintering process, since the diffusion rate of silicon in the aluminum layer is extremely fast, the silicon at the position of the laser opening will be quickly eutecticized with aluminum and dispersed into the aluminum-silicon eutectic alloy solution. Although silicon still moves toward the surface of the silicon wafer during the cooling process, however, once the molten aluminum is generated at such a high speed that aluminum-silicon eutectic melting continues to function, but the silicon that diffused too far will be too late to return to the laser opening positions during the cooling process. As a result, the silicon at the laser opening positions has a morphology, which is like being hollowed out, i.e. the so-called void. If the particle size of the aluminum powder and the thickness of the alumina shell on the surface of the aluminum powder can be controlled when the aluminum powder is applied such that the eutectic reaction of aluminum-silicon system is not excessive, then the problem of voids that occurs when silicon is too excessively diffused to return to the laser opening positions in time during cooling can be avoided.

Therefore, after repeated studies and explorations, the present inventors have found out the relationship between the particle size of the aluminum powder and the thickness of the alumina layer on the surface of the aluminum powder is critical to the problems, such as powder extraction, aluminum beads, void occurring at local back surface field positions, etc. Because the thickness of the alumina layer depends on the oxygen content of the aluminum powder, the relationship between the particle size of the aluminum powder and the oxygen content of the aluminum powder is critical to the problems, such as powder extraction, aluminum beads, void occurring at local back surface field positions, etc. Through the appropriate control on the particle size/alumina layer ratio, the issues, such as powder extraction occurred during the sintering process can be effectively avoided. At the same time, by using a specific ratio of the particle size of aluminum powder and the oxygen content of the aluminum powder (the thickness of the surface alumina layer), it is possible to reduce the occurrence of aluminum powder extraction, aluminum beads, and voids at the local back surface field positions. Thus, the present invention is accomplished.

To achieve the above and other objects, the present invention provides an aluminum paste used for a local back surface field solar cell. The aluminum paste comprises large-sized aluminum powder; an organic vehicle including a solvent and a resin or cellulose; wherein a ratio of a median particle size (μm) to an oxygen content (%) (median particle size (μm)/oxygen content (%)) of the large-sized aluminum powder ranges from 10 to 15.

For the aluminum paste described above, the ratio (median particle size (μm)/oxygen content (%)) ranges from 11 to 13.

For the aluminum paste described above, the oxygen content of the large-sized aluminum powder ranges from 0.1 to 2.0 wt %.

For the aluminum paste described above, the oxygen content of the large-sized aluminum powder ranges from 0.3 to 1.0 wt %.

The aluminum paste described above further comprises small-sized aluminum powder, which accounts for 0.1 to 10 wt % of the aluminum paste.

For the aluminum paste described above, the large-sized aluminum powder and the small-sized aluminum powder together account for 65 to 85 wt % of the aluminum paste.

For the aluminum paste described above, the viscosity of the organic vehicle ranges from 1 to 15 Kcps.

The aluminum paste described above further comprises glass powders.

For the aluminum paste described above, the organic vehicle further comprises an additive, which is at least one selected from the group consisting of a dispersant, a leveling agent, a defoaming agent, a anti-settling agent, a thixotropic agent, and a coupling agent.

To achieve the above and other objects, the present invention also provides a local back surface field solar cell, which comprises the aluminum paste described above.

The aluminum paste used for a local back surface field solar cell and the local back surface field solar cell using the aluminum paste of the present invention can reduce the occurrence of powder extraction, aluminum beads, and voids at the local back surface field positions, which in turn increases the photoelectric conversion efficiency and Al layer peeling strength of the local back surface field solar cells.

DETAILED DESCRIPTION OF THE PREFERRED EMBODIMENTS

In order to fully understand the purpose, features, and effects of the present invention, a detailed description of the present invention will be given by the following specific examples.

The aluminum paste provided by the present invention substantially comprises large-sized aluminum powder and an organic vehicle, and may further include glass powder.

In the present specification, large-sized aluminum powder refers to the aluminum powder having a median particle size (D50) of 6.0 to 9.0 μm. Compared to large-sized aluminum powder, small-sized aluminum powder refers to the aluminum powder with a median particle size (D50) of 1.0 to 3.0 μm. In addition, in this specification, if the percentage "%" is not specifically limited, it means "wt %".

In an aluminum paste of a preferred embodiment, large-sized aluminum powder and small-sized aluminum powder are mixed and used. The large-sized aluminum powder and the small-sized aluminum powder may together account for 65 to 85% of the total weight of the aluminum paste, preferably 70 to 76%. The large-sized aluminum powder preferably accounts for 60 to 80 wt % of the total weight of the aluminum paste, and more preferably 60 to 70 wt %. The small-sized aluminum powder preferably accounts for 0.1 to 10 wt % of the total weight of the aluminum paste.

The organic vehicle includes an organic solvent and a resin or cellulose, and may further contain an additive. The organic vehicle accounts for 10 to 30 wt % of the total weight of the aluminum paste, preferably 20 to 28 wt %. At the same time, the viscosity of the organic vehicle ranges from 1 to 15 Kcps, preferably 10 to 15 Kcps. The aluminum paste may have a most preferred viscosity by controlling the viscosity of the organic vehicle.

The content of cellulose (or resin) accounts for about 1 to 4 wt % of the total weight of the aluminum paste, preferably 2 to 3 wt %. Meanwhile, in terms of the selection of resin, wood rosin or polyacrylonitrile may be selected, but it is not limited thereto. In terms of the selection of cellulose, ethyl cellulose or propyl cellulose may be selected, but it is not limited thereto.

The content of the organic solvent accounts for about 10 to 25 wt % of the total weight of the aluminum paste, preferably 18 to 20 wt %. At the same time, in term of the selection of the organic solvent, alcohol ether organic solvents, Ester alcohol film former (TEXANOL®, EASTMAN CHEMICAL COMPANY), terpineol or diethylene glycol butyl ether, but it is not limited thereto.

The content of the additive accounts for about 0.2 to 2.5 wt % of the total weight of the aluminum paste, preferably 1.5 to 2 wt %. Meanwhile, in term of the selection of the additive, a dispersant, a leveling agent, a defoaming agent, an anti-settling agent, a thixotropic agent, and a coupling agent may be selected, but it is not limited thereto.

In the aluminum paste of a preferred embodiment, it contains glass frit. The glass frit may account for 0.1 to 5 wt % of the total weight of the aluminum paste, preferably 3 to 4 wt %. As for the selection of glass firt, vanadium-based or bismuth-based glass powder or other glass powder may be selected, and preferably the glass frits shown in the following Table 1 are used, but it is not limited thereto. A glass frit can be used alone, or a combination of glass frits can be used.

TABLE 1

| | |
|---|---|
| Glass frit 1 | $PbO-ZnO-B_2O_3-SiO_2$ |
| Glass frit 2 | $SiO_2-PbO-B_2O_3-Al_2O_3-ZrO_2$ |
| Glass frit 3 | $Bi_2O_3-ZnO-SiO_2-B_2O_3-Al_2O_3$ |
| Glass frit 4 | $Bi_2O_3-B_2O_3-Al_2O_3-BaO-ZnO$ |
| Glass frit 5 | $SiO_2-PbO-ZnO-B_2O_3-Al_2O_3$ |
| Glass frit 6 | $V_2O_5-B_2O_3-Al_2O_3-BaO-ZnO$ |

Measurement of Particle Size of Aluminum Powder and Oxygen Content

The particle size of the aluminum powder was measured with a laser scattering particle size analyzer-HORIBA LA950. In the measurement of aluminum powder, isopropyl alcohol (IPA) was used as the dispersant medium. Before the measurement, ultrasonic vibration was performed for the same period of time and the circulation was performed at the same speed. Each aluminum powder was measured three times to confirm the reproducibility of the particle size measurement. The measurement results are shown in Table 2. In addition, the oxygen content of the aluminum powder was measured with a HORIBA EMGA-820 nitrogen/oxygen detector, and the measurement results are also shown in Table 2.

TABLE 2

| Aluminum powder | Median particle size, D50 (μm) | Oxygen content (%) |
|---|---|---|
| Small-sized aluminum powder 1 | 2.132 | 1.0633 |
| Small-sized aluminum powder 2 | 1.997 | 1.1473 |
| Large-sized aluminum powder 1 | 6.216 | 0.4101 |
| Large-sized aluminum powder 2 | 6.453 | 0.4893 |
| Large-sized aluminum powder 3 | 6.366 | 0.5627 |
| Large-sized aluminum powder 4 | 8.176 | 0.6004 |
| Large-sized aluminum powder 5 | 8.429 | 0.4855 |
| Large-sized aluminum powder 6 | 7.993 | 0.5578 |
| Large-sized aluminum powder 7 | 7.248 | 0.7855 |

Therefore, from Table 2 above, the ratio of the median particle size D50 (μm)/oxygen content (%) of small-sized aluminum powders 1 to 2 and large-sized aluminum powders 1 to 7 can be calculated, as shown in Table 3.

TABLE 3

| Aluminum powder | Median particle size D50(μm)/Oxygen content (%) |
|---|---|
| Small-sized aluminum powder 1 | 2.01 |
| Small-sized aluminum powder 2 | 1.74 |
| Large-sized aluminum powder 1 | 15.15 |
| Large-sized aluminum powder 2 | 13.19 |
| Large-sized aluminum powder 3 | 11.31 |
| Large-sized aluminum powder 4 | 13.62 |
| Large-sized aluminum powder 5 | 17.36 |
| Large-sized aluminum powder 6 | 14.33 |
| Large-sized aluminum powder 7 | 9.23 |

Formation of the Passivation Layer of the LBSF Solar Cell

The passivation layer of the LBSF silicon wafer can be coated on the silicon wafer by ALD or CVD process using $SiO_x$, $TiO_x$, $AlO_x$, and then the capping layer with a thickness of 70 to 120 nm is deposited on the passivation layer by CVD process using $SiN_x$.

The silicon wafer having the back passivation layer can be processed in advance using a laser to form different patterns in the passivation layer by removing some of materials of the passivation layer to facilitate the contact and reaction of aluminum and silicon when the conductive paste is co-fired after printing and the formation of the local back surface field. The pattern of the laser opening may be a dot having a diameter of 30 to 150 μm, a dashed line having a line width of 30 to 100 μm, or a solid line having a line width of 30 to 100 μm.

Synthesis Examples

The aluminum paste was prepared by using the aluminum paste preparation step of a conventional local back surface field solar cell.

The aluminum pastes of Comparative Examples 1 to 4 and Embodiments 1 to 5 were prepared by the following steps:

Step 1: The resin or cellulose (ethyl cellulose polymer, ETHOCEL Standard 20, Dow DuPont Co., Ltd.)/additives (thixotropes, castor oil modified derivatives, Thiaxatrol ST, Elementis-specialties Co., Ltd.)/organic solvents (terpineol/diethylene glycol butyl ether mixed with a volume ratio of 1:3) were added into the reaction tank, stirred and mixed to form the uniform organic vehicle.

Step 2: Adding glass powder, aluminum powder and other components to the organic vehicle obtained in step 1 to form the mixed aluminum paste.

Step 3: The mixed aluminum paste obtained in step 2 was stirred with a high-speed stirrer to become thoroughly mixed and then ground with a three-roll mill (brand model: Exakt 80E) to obtain the aluminum paste.

The composition ratios of the aluminum pastes produced through the above synthesis examples (Comparative Examples 1 to 4 (CE 1-4) and Embodiments 1 to 5 (EM 1-5)) are shown in Table 4.

TABLE 4

| Aluminum paste | CE 1 | CE 2 | CE 3 | CE 4 | EM 1 | EM 2 | EM 3 | EM 4 | EM 5 |
|---|---|---|---|---|---|---|---|---|---|
| Resin or cellulose | 2.0% | 2.0% | 2.0% | 2.0% | 2.0% | 2.0% | 2.0% | 2.0% | 2.0% |
| Additive | 1.5% | 1.5% | 1.5% | 1.5% | 1.5% | 1.5% | 1.5% | 1.5% | 1.5% |
| Organic solvent | 18.6% | 18.6% | 18.6% | 18.6% | 18.6% | 18.6% | 18.6% | 18.6% | 18.6% |

TABLE 4-continued

| Aluminum paste | CE 1 | CE 2 | CE 3 | CE 4 | EM 1 | EM 2 | EM 3 | EM 4 | EM 5 |
|---|---|---|---|---|---|---|---|---|---|
| Glass powder 6 | 3.0% | 3.0% | 3.0% | 3.0% | 3.0% | 3.0% | 3.0% | 3.0% | 3.0% |
| Glass powder 5 | 0.9% | 0.9% | 0.9% | 0.9% | 0.9% | 0.9% | 0.9% | 0.9% | 0.9% |
| Small-sized aluminum powder 1 | 8.0% | | 8.0% | 8.0% | 8.0% | 8.0% | 8.0% | 8.0% | |
| Small-sized aluminum powder 2 | | 8.0% | | | | | | | |
| Large-sized aluminum powder 1 | 66.0% | 66.0% | | | | | | | |
| Large-sized aluminum powder 2 | | | | | 66.0% | | | | |
| Large-sized aluminum powder 3 | | | | | | 66.0% | | | 74.0% |
| Large-sized aluminum powder 4 | | | | | | | 66.0% | | |
| Large-sized aluminum powder 5 | | | 66.0% | | | | | | |
| Large-sized aluminum powder 6 | | | | | | | | 66.0% | |
| Large-sized aluminum powder 7 | | | | 66.0% | | | | | |
| Total | 100.0% | 100.0% | 100.0% | 100.0% | 100.0% | 100.0% | 100.0% | 100.0% | 100.0% |

Test Examples

The aluminum pastes obtained in the above Embodiments 1 to 5 and Comparative Examples 1 to 4 were used to fabricate the local back surface field solar cells according to the following steps:

Step 1 (printing): The backside silver paste and the front side silver gel paste were respectively printed on the back surface of the silicon substrate and the front surface of the PERC semifinished product by coating or screen printing (SiN$_x$ on the front surface and 6 nm Al$_2$O$_3$ passivation layer and 80 nm SiN$_x$ top capping layer on the back surface), and then dried in an oven at 200° C. Thereafter, the aluminum pastes prepared in Embodiments 1 to 5 and Comparative Examples 1 to 4 were printed separately on the back surface of the silicon substrate where it was not covered by silver. The silicon substrates on which the aluminum pastes prepared in Embodiments 1 to 5 and Comparative Examples 1 to 4 were printed separately were dried to prepare the printed silicon substrates to be sintered.

Step 2 (sintering): After the drying step was completed, a conveyor furnace was used to carry out the sintering process (the speed of the conveyor belt is 180 to 280 inch/min). The printed silicon substrates to be sintered and prepared in Step 1 were sintered at a firing peak temperature of 720 to 820° C. to produce a local back surface field solar cell having a Al layer with a thickness of about 20-30 μm. After the sintering process, the media, such as the organic substances, contained in the Al layer on the cell can be burned out, and aluminum can dope into the silicon semiconductor substrate from the laser opening positions for generating the local back surface field (L-BSF).

According to the above steps, the local back surface field solar cells were fabricated using the aluminum pastes of Embodiments 1 to 5 and Comparative Examples 1 to 4, respectively, and tested for the following properties:

Measurement of photoelectric conversion efficiency: the aluminum pastes obtained in the foregoing Embodiments 1 to 5 and Comparative Examples 1 to 4 were printed on the blank PERC wafers using the same screen and printing conditions. After being dried at 200° C., the cells were sent into the conveyor furnace for burning out organics and sintering of aluminum paste. The sintered cells were tested for the electrical properties by the voltage/current test (IV test). The photoelectric conversion efficiency (Eff) (%), open circuit voltage (Voc (mv)), and fill factor (FF (%)) of the local back surface field solar cells were measured by the testing machine QuickSun 120CA produced by Endeas Corp. from Finland. The results are shown in Table 5.

TABLE 5

| Aluminum paste | D50 of large-sized aluminum powder (μm)/oxygen content (%) | Eff (%) | Voc(V) | Isc(A) | F.F(%) |
|---|---|---|---|---|---|
| CE 1 | 15.16 | 20.55 | 0.6618 | 9.521 | 77.61 |
| CE 2 | 15.16 | 20.58 | 0.6627 | 9.524 | 77.62 |
| CE 3 | 17.36 | 20.56 | 0.6625 | 9.518 | 77.61 |
| CE 4 | 9.23 | 20.50 | 0.6610 | 9.516 | 77.55 |
| EM 1 | 13.188 | 20.65 | 0.6644 | 9.521 | 77.69 |
| EM 2 | 11.31 | 20.64 | 0.6643 | 9.516 | 77.70 |
| EM 3 | 13.62 | 20.59 | 0.6627 | 9.525 | 77.64 |
| EM 4 | 14.33 | 20.59 | 0.6630 | 9.520 | 77.63 |
| EM 5 | 11.31 | 20.47 | 0.6607 | 9.513 | 77.50 |

Figure 1A:
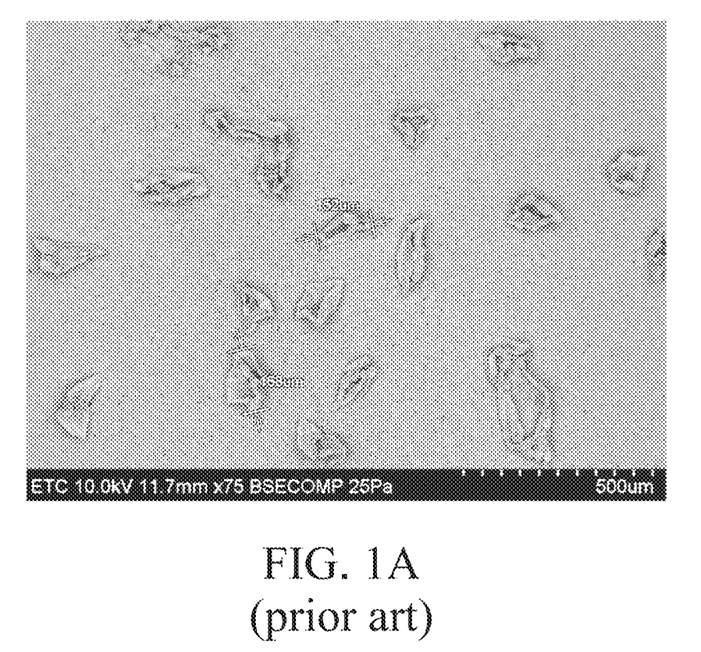
FIG. 1A (prior art) is a graph showing the results of extracted aluminum powder on Al layer using the scanning electron microscopy.
Figure 1B:
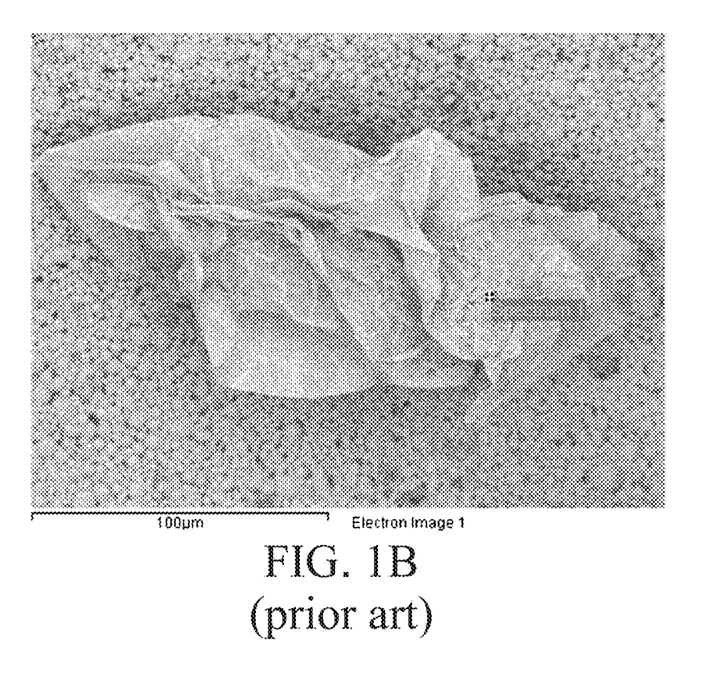
FIG. 1B (prior art) is a graph showing the results of extracted aluminum powder on Al layer using the scanning electron microscopy.

Powder Extraction Test: Comparative Examples 1 to 4 and Embodiments 1 to 5 were observed on the surface of the aluminum layer of the cells, and the relationship between the powder extraction of aluminum layers and the peak temperatures of the conveyor furnace was recorded. The results are shown in Table 6. Moreover, the figures of the powder extraction of aluminum layers were shown in FIG. 1A (prior art) and FIG. 1B (prior art).

Next, compared to Comparative Examples 1 to 4 and Embodiments 1 to 4, from the result of Embodiment 5, which didn't use the small-sized aluminum powder and had a ratio of D50 (μm)/oxygen content (%) of large-sized aluminum powder that fell within the range claimed by the

TABLE 6

| Aluminum paste | D50 of large-sized aluminum powder (μm)/ oxygen content (%) | Temperature (° C.) | | | | |
|---|---|---|---|---|---|---|
| | | 750 | 760 | 770 | 780 | 800 |
| CE 1 | 15.16 | Very severe | Very severe | Very severe | Severe | Severe |
| CE 2 | 15.16 | Severe | Severe | Severe | Severe | Severe |
| CE 3 | 17.36 | Very severe | Very severe | Very severe | Severe | Severe |
| CE 4 | 9.23 | Slight | Very slight | Non | Non | Non |
| EM 1 | 13.188 | Slight | Very slight | Non | Non | Non |
| EM 2 | 11.31 | Slight | Very slight | Non | Non | Non |
| EM 3 | 13.62 | Slight | Very slight | Non | Non | Non |
| EM 4 | 14.33 | Slight | Very slight | Non | Non | Non |
| EM 5 | 11.31 | Very slight | Non | Non | Non | Non |

Non: 0 particle/cm$^2$; Very slight: 1~5 particles/cm$^2$; Slight: 5~10 particles/cm$^2$;
Severe: 10-15 particles/cm$^2$; Very severe: >15 particles/cm$^2$.

Figure 2A:
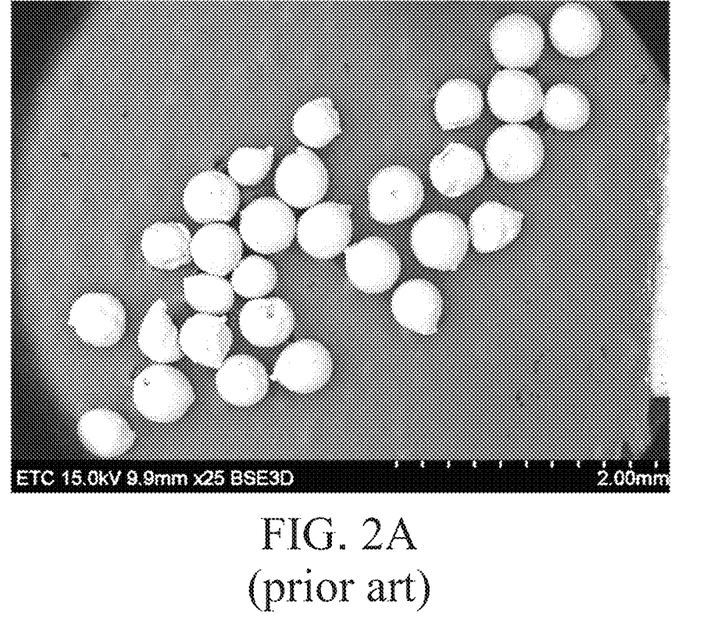
FIG. 2A (prior art) is a graph showing the results of beads on Al layer using the scanning electron microscopy.
Figure 2B:
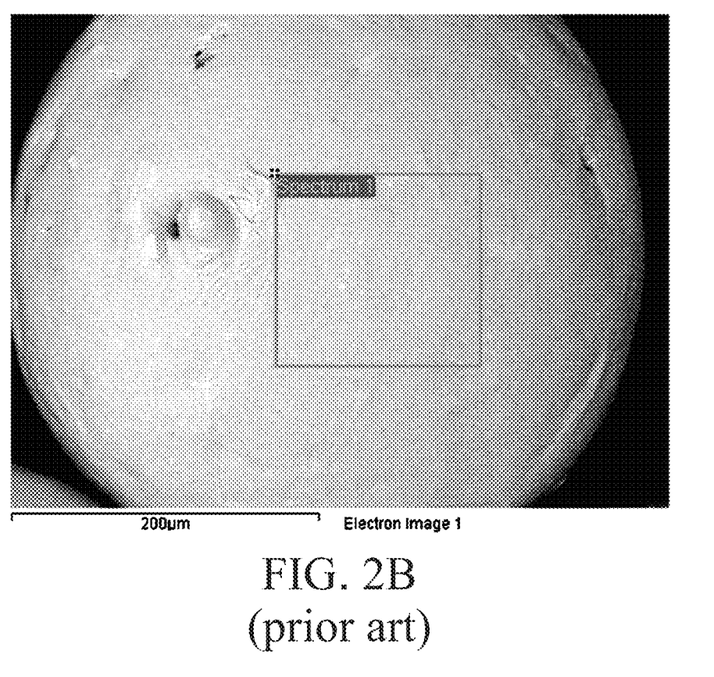
FIG. 2B (prior art) is a graph showing the results of beads on Al layer using the scanning electron microscopy.

Aluminum Bead Test: Comparative Examples 1 to 4 and Embodiments 1 to 4 were observed on the surface of the aluminum layer of the cells, and the relationship between the generation of aluminum beads and the peak temperatures of the conveyor furnace was recorded. The results are shown in Table 7. Moreover, the figures of the aluminum beads were shown in FIG. 2A (prior art) and FIG. 2B (prior art).

present invention, it could be seen that Embodiment 5 could achieve the desired effect that powder extraction and aluminum beads were hardly generated (or only slightly generated). However, in terms of photoelectric conversion efficiency (Eff), Embodiment 5 still had room for improvement.

Next, from the results of Comparative Examples 1, 3 to 4, and Embodiments 1 to 4, it can be seen that by using the

TABLE 7

| Aluminum paste | D50 of large-sized aluminum powder (μm)/ oxygen content (%) | Temperature (° C.) | | | | |
|---|---|---|---|---|---|---|
| | | 750 | 760 | 770 | 780 | 800 |
| CE 1 | 15.16 | Non | Non | Slight | Severe | Severe |
| CE 2 | 15.16 | Non | Non | Slight | Severe | Severe |
| CE 3 | 17.36 | Non | Non | Slight | Severe | Severe |
| CE 4 | 9.23 | Slight | Very slight | Non | Non | Non |
| EM 1 | 13.188 | Slight | Non | Non | Non | Non |
| EM 2 | 11.31 | Slight | Non | Non | Non | Non |
| EM 3 | 13.62 | Slight | Very slight | Non | Non | Non |
| EM 4 | 14.33 | Slight | Very slight | Non | Non | Non |
| EM 5 | 11.31 | Very slight | Non | Non | Non | Non |

Non: 0 particle/silicon wafer; Very slight: 1~5 particles/silicon wafer; Slight: 5~10 particles/silicon wafer;
Severe: 10~15 particles/silicon wafer; Very severe: >15 particles/silicon wafer.

Please refer to Tables 5 to 7. From the results of Comparative Examples 1 to 2, it can be seen that while maintaining the same ratio of D50 (μm)/oxygen content (%) of the large-sized aluminum powder, the photoelectric conversion efficiency (Eff) can be slightly increased by reducing the ratio of D50 (μm)/oxygen content (%) of the small-sized aluminum powder, but the powder extraction is severe or very severe at the peak temperature (750-800° C.). Therefore, adjusting the ratio of D50 (μm)/oxygen content (%) of the small-sized aluminum powder cannot significantly improve the powder extraction, and both Comparative Examples 1 and 2 are not good.

same small-sized aluminum powder, the photoelectric conversion efficiency (20.59~20.65%) of Embodiments 1 to 4 that have a ratio of D50 (μm)/oxygen content (%) of large-sized aluminum powder within 10 to 15 are all better than that of Comparative Examples 1, 3 to 4 (20.50~20.56). Among them, the photoelectric conversion efficiencies of Embodiments 1 to 2 exceed 20.60%, so they are preferable.

Furthermore, in comparison with the results of powder extraction and aluminum beads, Comparative Examples 1 to 3 all produced severe powder extraction or aluminum beads, which was not good. However, although the results of powder extraction and aluminum beads of Comparative Example 4 were almost the same as those of Embodiments 1 to 4, the degree of powder extraction and aluminum beads were both slightly below. The photoelectric conversion efficiency of Comparative Example 4 was only 20.50%, which was worse than those of Comparative Examples 1 to 3, so Comparative Example 4 was still poor. In addition, Embodiments 1 to 2 not only had the highest photoelectric conversion efficiency (more than 20.60%), but also generated almost no powder extraction and aluminum beads, so Embodiments 1 to 2 were preferred embodiments. Therefore, in the void test described below, only the results of Comparative Example 1 and Embodiments 1 to 2 were compared.

Figure 3A:
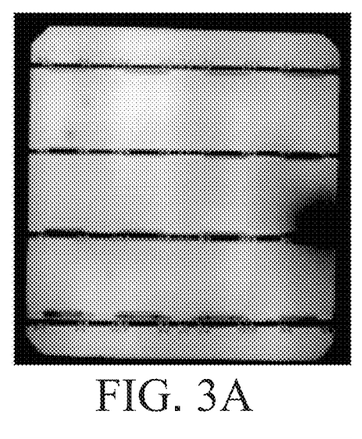
FIG. 3A is a graph showing the results of Comparative Example 1 in which voids were observed using the electroluminescence defect detector.
Figure 3B:
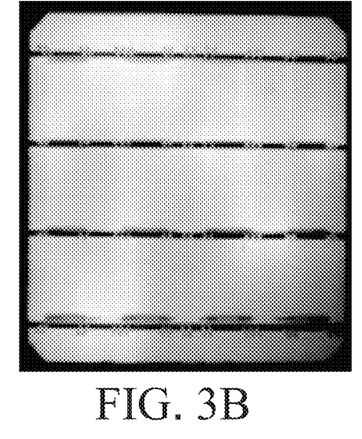
FIG. 3B is a graph showing the results of Embodiment 1 in which voids were observed using the electroluminescence defect detector.
Figure 3C:
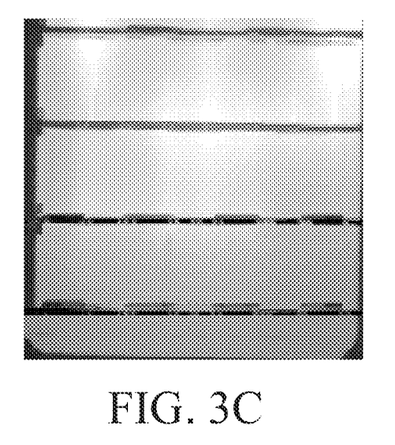
FIG. 3C is a graph showing the results of Embodiment 2 in which voids were observed using the electroluminescence defect detector.

Void Test: Using the electroluminescence defect detector, the results of Comparative Example 1 and Embodiments 1 to 2 were observed and shown in FIGS. 3A to 3C. FIG. 3A is a graph showing the results of Comparative Example 1 in which voids were observed using the electroluminescence defect detector. FIG. 3B is a graph showing the results of Embodiment 1 in which voids were observed using the electroluminescence defect detector. FIG. 3C is a graph showing the results of Embodiment 2 in which voids were observed using the electroluminescence defect detector.

From FIGS. 3A to 3C, it can be found that the color of Comparative Example 1 is darker, which means more voids are generated, so Comparative Example 1 has the problem of void generation. In contrast, both the colors of Embodiments 1 to 2 are lighter (brighter) than that of Comparative Example 1, which means that there are almost no voids generated in Embodiments 1 to 2, so Embodiments 1 to 2 are preferable.

Therefore, in this embodiment, the ratio of median particle size (μm) to oxygen content (%) (median particle size (μm)/oxygen content (%)) of the large-sized aluminum powder is controlled to be within 10 to 15 (preferably 11 to 13), which can achieve the effect of suppressing the powder extraction, aluminum beads, and voids while maintaining the desired electrical properties.

The present invention has been disclosed in the above preferred embodiments. However, it should be understood by those skilled in the art that this embodiment is only for describing the present invention and should not be interpreted as limiting the scope of the present invention. It should be noted that any change and replacement equivalent to the embodiments should be included within the scope of the present invention. Therefore, the protection scope of the present invention shall be defined by the claims.

What is claimed is:

1. An aluminum paste used for a local back surface field solar cell, comprising:
   large-sized aluminum powder, having a median particle size of 6.0 to 9.0 μm;
   an organic vehicle including a solvent and a resin or cellulose; wherein
   a ratio of a median particle size (μm) to an oxygen content (%) (median particle size (μm)/oxygen content (%)) of the large-sized aluminum powder ranges from 10 to 15, and the large-sized aluminum powder accounts for 60 to 80 wt % of the aluminum paste.

2. The aluminum paste of claim 1, wherein the ratio (median particle size (μm)/oxygen content (%)) ranges from 11 to 13.

3. The aluminum paste of claim 1, wherein the oxygen content of the large-sized aluminum powder ranges from 0.1 to 2.0 wt %.

4. The aluminum paste of claim 3, wherein the oxygen content of the large-sized aluminum powder ranges from 0.3 to 1.0 wt %.

5. The aluminum paste of claim 1 further comprising small-sized aluminum powder, which accounts for 0.1 to 10 wt % of the aluminum paste.

6. The aluminum paste of claim 5, wherein the large-sized aluminum powder and the small-sized aluminum powder together account for 65 to 85 wt % of the aluminum paste.

7. The aluminum paste of claim 1, wherein the viscosity of the organic vehicle ranges from 1 to 15 Kcps.

8. The aluminum paste of claim 1, further comprising glass powder.

9. The aluminum paste of claim 1, wherein the organic vehicle further comprises an additive, which is at least any one selected from the group consisting of a dispersant, a leveling agent, a defoaming agent, an anti-settling agent, a thixotropic agent, and a coupling agent.

10. A local back surface field solar cell, comprising the aluminum paste of any one of claim 1.

* * * * *